United States Patent [19]

Stodieck

[11] Patent Number: 5,450,460
[45] Date of Patent: Sep. 12, 1995

[54] NON-VOLATILE ELECTRONIC COUNTER WITH IMPROVED RELIABILITY AND A SUBSTANTITALLY INCREASED MAXIMUM COUNT

[75] Inventor: Robert Stodieck, Santa Clara, Calif.

[73] Assignee: National Semiconductor Corporation, Santa Clara, Calif.

[21] Appl. No.: 208,624

[22] Filed: Mar. 9, 1994

[51] Int. Cl.⁶ ............................................. G06M 3/00
[52] U.S. Cl. .................................... 377/44; 377/24.1; 377/26
[58] Field of Search ........................... 377/24.1, 26, 44

[56] References Cited

U.S. PATENT DOCUMENTS

| | | | |
|---|---|---|---|
| 4,663,770 | 5/1987 | Murray et al. | 377/28 |
| 5,181,231 | 1/1993 | Parikh et al. | 377/26 |
| 5,231,592 | 7/1993 | Itoh | 377/26 |

OTHER PUBLICATIONS

A. M. Izmailov et al., Digital Counter Decades with Operational and Long-Term Memory, *Instruments and Experimental Techniques*, vol. 23, No. 6, Pt 1, pp. 1378–1380, Nov.–Dec 1980.

J. Lebel, A Mobile Facility for Electromagnetic Environ, *International Electrical, Electronics Conference & Exposition*, pp. 10–11, Oct. 5–7, 1981.

Data Sheet for HC2090, Hughes Semiconductor Products Center, two pages.

*Primary Examiner*—Margaret Rose Wambach
*Attorney, Agent, or Firm*—Limbach & Limbach; Vincenzo D. Pitruzella

[57] ABSTRACT

A non-volatile electronic counter provides a substantially increased maximum count by utilizing a ring counting sequence to count the first $n-1$ events out of every n events, and a base-2 counting sequence to count each nth event. Each counting position of the ring counting sequence and the base-2 counting sequence is implemented with a memory stage that stores the logical state of the counting position when power is removed. Each memory stage can be implemented with redundant memory cells and voting logic, which provides the logic state represented by a majority of the redundant memory cells, to increase the reliability of the count.

36 Claims, 5 Drawing Sheets

FIG. 3

| Output | | | | Input | | | | | | | | | | | | | | | | |
|---|---|---|---|---|---|---|---|---|---|---|---|---|---|---|---|---|---|---|---|---|
| A | B | C | D | E | F | G | H | I | J | K | L | M | N | O | P | Q | R | S | T | |
| 0 | 0 | 0 | 0 | 0 | x | x | x | x | x | x | x | x | x | x | x | x | x | x | x | 0 |
| 0 | 0 | 0 | 1 | 1 | 0 | x | x | x | x | x | x | x | x | x | x | x | x | x | x | 1 |
| 0 | 0 | 1 | 0 | 1 | 1 | 0 | x | x | x | x | x | x | x | x | x | x | x | x | x | 2 |
| 0 | 0 | 1 | 1 | 1 | 1 | 1 | 0 | x | x | x | x | x | x | x | x | x | x | x | x | 3 |
| 0 | 1 | 0 | 0 | 1 | 1 | 1 | 1 | 0 | x | x | x | x | x | x | x | x | x | x | x | 4 |
| 0 | 1 | 0 | 1 | 1 | 1 | 1 | 1 | 1 | 0 | x | x | x | x | x | x | x | x | x | x | 5 |
| 0 | 1 | 1 | 0 | 1 | 1 | 1 | 1 | 1 | 1 | 0 | x | x | x | x | x | x | x | x | x | 6 |
| 0 | 1 | 1 | 1 | 1 | 1 | 1 | 1 | 1 | 1 | 1 | 0 | x | x | x | x | x | x | x | x | 7 |
| 1 | 0 | 0 | 0 | 1 | 1 | 1 | 1 | 1 | 1 | 1 | 1 | 0 | x | x | x | x | x | x | x | 8 |
| 1 | 0 | 0 | 1 | 1 | 1 | 1 | 1 | 1 | 1 | 1 | 1 | 1 | 0 | x | x | x | x | x | x | 9 |
| 1 | 0 | 1 | 0 | 1 | 1 | 1 | 1 | 1 | 1 | 1 | 1 | 1 | 1 | 0 | x | x | x | x | x | A |
| 1 | 0 | 1 | 1 | 1 | 1 | 1 | 1 | 1 | 1 | 1 | 1 | 1 | 1 | 1 | 0 | x | x | x | x | B |
| 1 | 1 | 0 | 0 | 1 | 1 | 1 | 1 | 1 | 1 | 1 | 1 | 1 | 1 | 1 | 1 | 0 | x | x | x | C |
| 1 | 1 | 0 | 1 | 1 | 1 | 1 | 1 | 1 | 1 | 1 | 1 | 1 | 1 | 1 | 1 | 1 | 0 | x | x | D |
| 1 | 1 | 1 | 0 | 1 | 1 | 1 | 1 | 1 | 1 | 1 | 1 | 1 | 1 | 1 | 1 | 1 | 1 | 0 | x | E |
| 1 | 1 | 1 | 1 | 1 | 1 | 1 | 1 | 1 | 1 | 1 | 1 | 1 | 1 | 1 | 1 | 1 | 1 | 1 | 0 | F |

A=EFGHIJKL
B=EFGH(I/+IJ/+IJK/+IJKL/)
C=EF((G/+GH/)+GHIJ((K/+KL/)+KLMN((O/+OP/)+OPQR)))
D=E(F/+FG(H/+HI(J/+JK(L/+LM(N/+NO(P/+PQ(R/+RS))))))))
Carry=ABCD

NON-VOLATILE ELECTRONIC COUNTER WITH IMPROVED RELIABILITY AND A SUBSTANTITALLY INCREASED MAXIMUM COUNT

BACKGROUND OF THE INVENTION

1. Field of the Invention

The present invention relates to non-volatile electronic counters and, in particular, to a non-volatile electronic counter with improved reliability and a substantially increased maximum count.

2. Description of the Related Art

Historically, electro-mechanical counters have been utilized to maintain a non-volatile record of a variety of events from the number of miles driven by an automobile to the amount of services, such as power, gas, or water, that each individual consumer within a utility system has consumed. More recently, non-volatile electronic counters have begun to replace electro-mechanical counters due to the increased flexibility provided by electronic counters. For example, due to the high cost associated with periodically manually reading each consumer's meter, utility systems have begun evaluating techniques for utilizing non-volatile electronic counters which can be remotely accessed and read.

One common technique for implementing a non-volatile electronic counter is to utilize a microcontroller or simple counting logic to count the number of events, such as the miles driven or services consumed, and a conventional electrically-erasable-programmable-read-only-memory (EEPROM) to maintain a non-volatile record of the count.

With this technique, the microcontroller or counting logic typically receives an external signal which indicates that an event has occurred and then increments the count held by the EEPROM. Typically, the microprocessor or counting logic stores the count in the EEPROM as a base-2 or binary representation of the number.

The principal disadvantage of this implementation is that the maximum count of the counter is limited by the lifecycle of the EEPROM. The current state of EEPROM technology is limited to producing memory cells with a maximum lifecycle of approximately 1,000,000 logic state transitions, e.g., transitioning from a zero to a one or from a one to a zero. As is well known, when a base-2 representation is utilized, the least significant counting position of the representation changes its logical state with each count.

This, in effect, limits a standard EEPROM to 1,000,000 counts since after 1,000,000 counts the memory cell representing the least significant counting position of the count will have "worn out". For those applications where hundreds of millions of counts are required, conventional EEPROMs fail to provide the endurance which is characteristic of the current electro-mechanical counters.

A further disadvantage of this implementation is reliability. When a single EEPROM memory cell "wears out", the subsequent count represented by the EEPROM is no longer valid. For example, if the memory cell representing the least significant counting position becomes stuck and no longer changes its logical state with each additional count, the result is that the entire counter becomes stuck.

In addition, when microcontrollers are utilized, the periodic "crashes" which commonly result from transient conditions, such as power surges, frequently cause the microcontroller to skip through its code and begin executing its instructions out of sequence. This out-of-sequence code execution often results in erroneous counts being written to the EEPROM.

In addition, transient conditions frequently randomize the state of both the data and the state control registers of volatile counter logic. This can result in random data also being recorded in the non-volatile counter register.

Thus, there is a need for a non-volatile electronic counter which can reliably maintain a non-volatile record of counts well in excess of 1,000,000.

SUMMARY OF THE INVENTION

The present invention provides a non-volatile electronic counter that reliably stores a count well in excess of 1,000,000 counts by utilizing a ring counting sequence to count the first $n-1$ events out of every n events, and a base-2 counting sequence to count each nth event. As a result, the logic state of the memory cell that represents the least significant counting position in the base-2 counting sequence is no longer changed in response to each detected event, thereby removing the maximum count limitation faced by traditional non-volatile counters.

By storing a larger number of detected events, non-volatile electronic counters can be utilized in a wide array of new applications, such as automobiles, where a maximum count of approximately 1,000,000 cycles is too limiting. Further, by increasing the reliability of the count stored by the counter, non-volatile electronic counters can be utilized in applications, such as service metering, where accurate records are essential.

A non-volatile counter that counts a plurality of event signals in accordance with the present invention includes a plurality of non-volatile memory cells which are logically divided into a first sequence of memory cells and a second sequence of memory cells. In addition, the second sequence of memory cells begins with a least significant memory cell. The counter also includes a counting logic stage that responds to the first $n-1$ event signals out of every n event signals by sequentially changing the logic state of one memory cell in the first sequence of memory cells each time the event signal is detected. The counting logic stage also changes the logic state of the least significant memory cell each time the nth event signal is detected, and changes the logic state of each remaining memory cell of the second sequence of memory cells each time the logic state of the immediately preceding memory cell in the second sequence of memory cells has been changed twice.

In a first alternative embodiment, the counter of the present invention can be implemented by utilizing a plurality of non-volatile memory stages which are logically divided into a first sequence of memory stages and a second sequence of memory stages. As above, each memory stage has a logic state that represents a single counting position in a counting sequence. Also, the second sequence of memory stages begins with a least significant memory stage. The counter of the first alternative embodiment also includes a counting logic stage that responds to the first $n-1$ event signals out of every n event signals by sequentially changing the logic state of one memory stage in the first sequence of memory stages each time the event signal is detected. The counting logic stage also changes the logic state of the least significant memory stage each time the nth event signal is detected, and changes the logic state of each remaining memory stage in the second sequence of memory stages each time the logic state of the immediately preceding memory stage in the second sequence of memory stages has been changed twice.

In the first alternative embodiment, a memory stage can be implemented with a single memory cell or with at least three memory cells and a voting logic stage where the voting logic stage generates a memory stage output signal that represents the logic state held by a majority of the at least three memory cells.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 3 is a truth table illustrating the operation of priority encoder 120.

DETAILED DESCRIPTION

Figure 1:
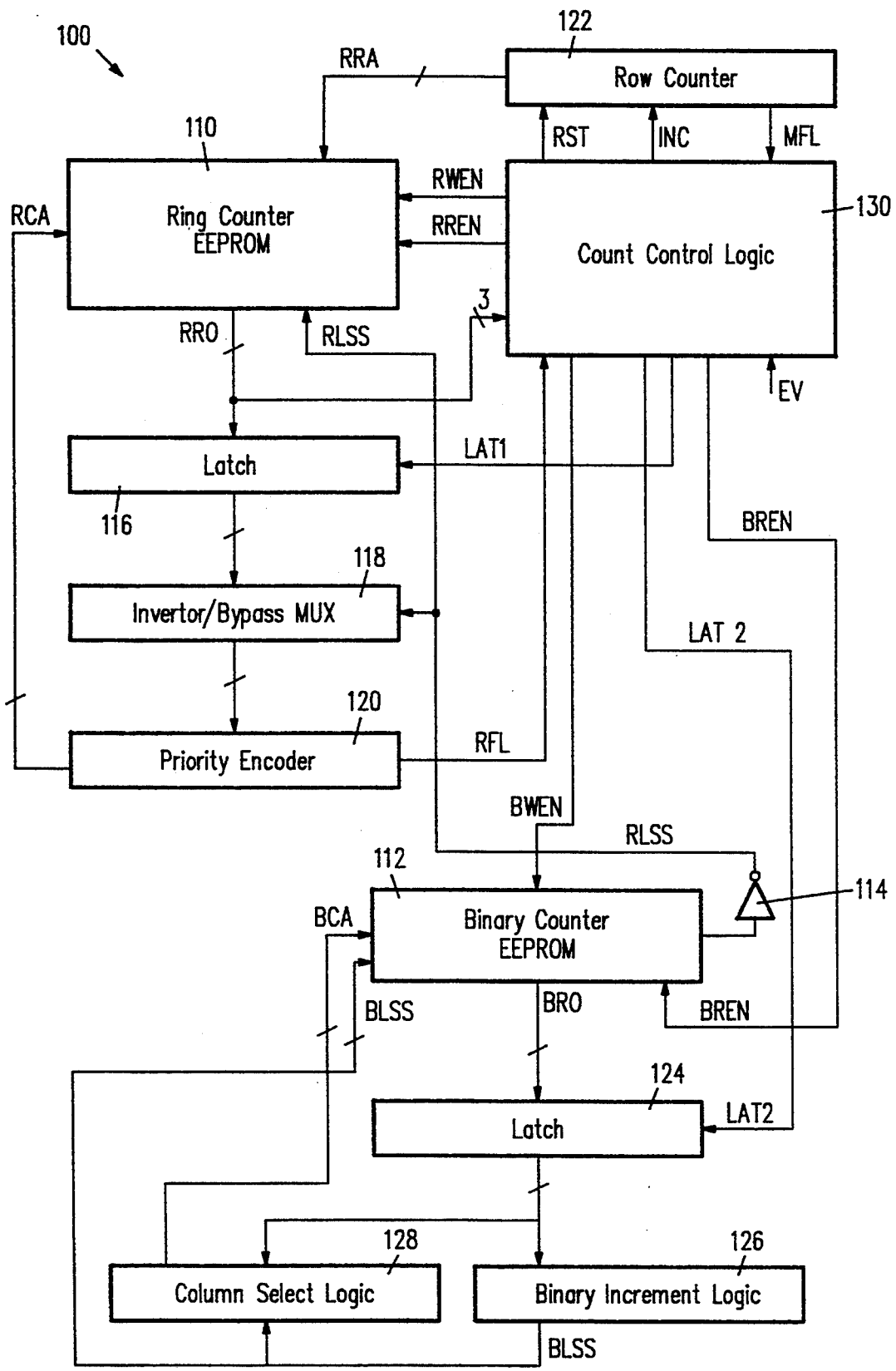
FIG. 1 is a block diagram illustrating an embodiment of a non-volatile counter 100 in accordance with the present invention.

FIG. 1 shows a block diagram that illustrates an embodiment of a non-volatile counter 100 in accordance with the present invention. As stated above, the maximum count of a non-volatile counter which utilizes a base-2 counting sequence is limited by the memory cell that represents the least significant counting position because that memory cell changes logic states each time an event is detected. As a result, the memory cell that represents the least significant counting position tends to wear out first.

As described in greater detail below, counter 100 maintains a non-volatile count of a greater number of events than is possible with traditional non-volatile counters by utilizing a ring counting sequence to count the first n−1 events out of every n events, and a base-2 counting sequence to count each nth event. Thus, by properly selecting the value of n, the memory cell that represents the least significant counting position will no longer count limit the maximum count of the counter. As a result, the lifecycle of non-volatile counters can be greatly increased.

Figure 2:
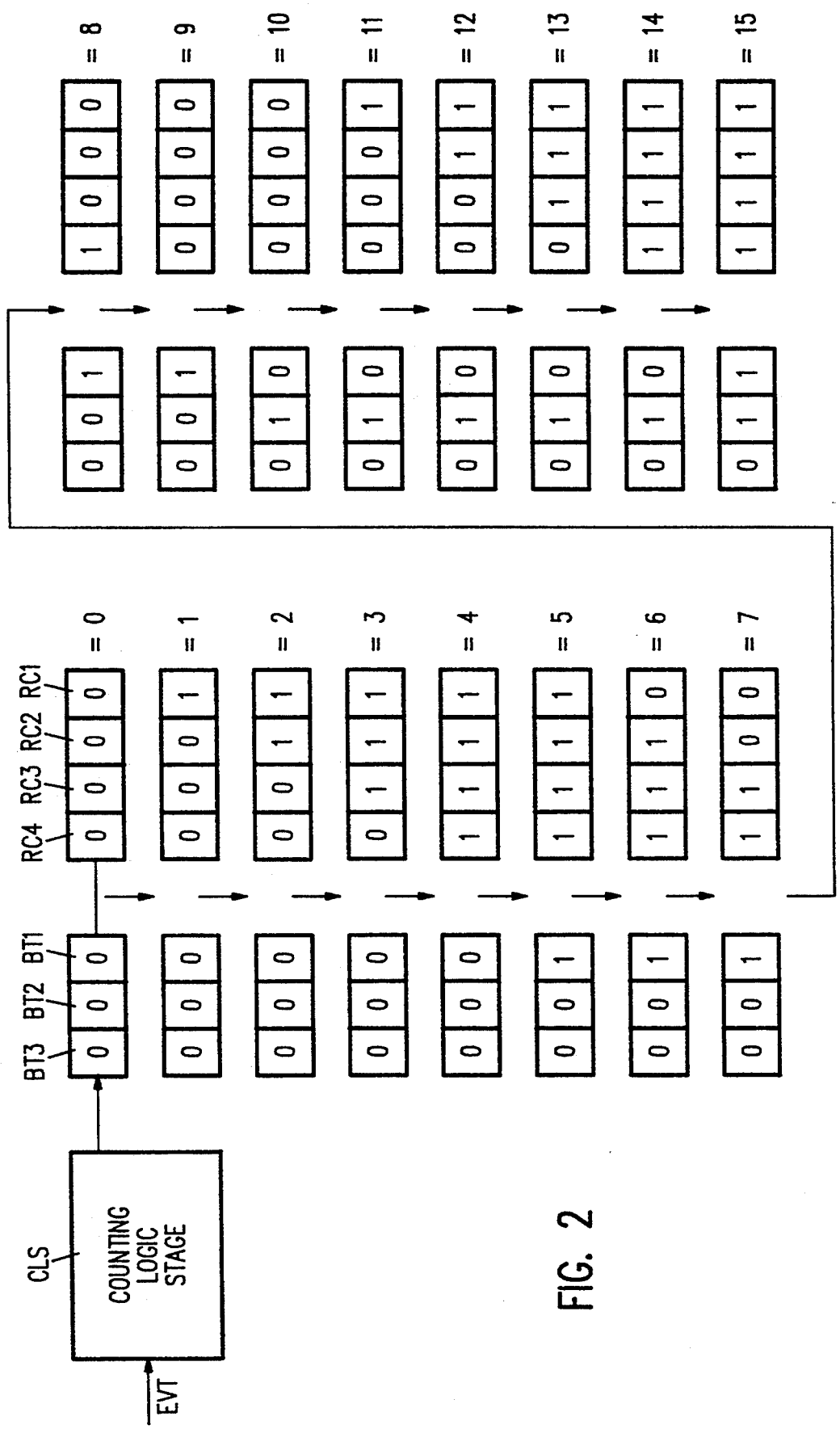
FIG. 2 is a block diagram of a counter in accordance with the present invention illustrating the operation of the counter for a count ranging from zero to fifteen.

FIG. 2 shows a block diagram of a counter in accordance with the present invention that illustrates the operation of the counter for a count ranging from zero to fifteen. As shown in FIG. 2, the counter includes a plurality of non-volatile memory cells which are logically divided into a first sequence of memory cells RC1–RC4 and a second sequence of memory cells BT1–BT3.

The first sequence of cells RC1–RC4 are utilized to implement the ring counting sequence while the second sequence of cells are utilized to implement the base-2 counting sequence. In addition, counting position BT1 represents the least significant counting position of the base-2 counting sequence. The number of memory cells utilized by the first sequence of cells and the second sequence of cells in FIG. 2 are solely for illustrative purposes. As will be described in greater detail below, the minimum number of memory cells is dependent on the maximum count required by each particular application and the lifecycle of the memory cells utilized to represent the counting positions.

As further shown in FIG. 2, the counter also includes a counting logic stage CLS that changes the logic states stored in the first sequence of cells RC1–RC4 and the second sequence of cells BT1–BT3 in response to a series of event signals EVT. In operation, counting logic stage CLS responds to the first n−1 event signals out of every n event signals by changing the logic state of one memory cell in the first sequence of memory cells each time the event signal EVT is detected.

In addition, counting logic stage CLS changes the logic state of the least significant memory cell in the second sequence of cells BT1–BT3 each time the nth event signal is detected, and changes the logic state of each remaining memory cell in the second sequence of memory cells BT2–BT3 each time the logic state of the memory cell that represents the preceding counting position has been changed twice.

Thus, each counting position within the ring counting sequence and the base-2 counting sequence is represented as a logic low when the count is zero. As the count incrementally increases from zero to five, the logic state of memory cells RC1–RC4 and BT1 are sequentially changed one position at a time until each of the memory cells RC1–RC4 and BT1 is represented as a logic high.

As the count increases from five to ten, the ring counting sequence continues by sequentially changing the logic states of memory cells RC1–RC4 and BT1 one counting position at a time until each of the memory cells RC1–RC4 and BT1 is again represented as a logic low.

As can be seen in FIG. 2, each time the logical state of memory cell BT1 changes twice, e.g. from a logic low to a logic high and back again to a logic low, the base-2 counting sequence changes the logic state of memory cell BT2 to a logic high. Similarly, as the count proceeds, the base-2 counting sequence changes the logic state of memory cell BT3 each time memory cell BT2, which represents the previous counting position, changes its logic state twice.

The advantages of a non-volatile counter that utilizes both a ring counting sequence and a base-2 counting sequence can best be appreciated by considering the lifecycle statistics of a hypothetical memory cell. For example, if a memory cell which represents one counting position can withstand 1,000,000 logic changes before "wearing out", a conventional base-2 counting sequence would only be able to count to 1,000,000 because the memory cell that represents the least significant counting position would wear out after 1,000,000 increments.

On the other hand, the maximum count of a ring counting sequence is defined by the number of cells utilized in the sequence multiplied by the wear out factor. For example, when four cells are utilized, as shown in FIG. 2, each cell will change logic states only once to reach a count of four. Thus, 1,000,000 logic state changes are equivalent to a count of 4,000,000.

Similarly, if 1,000 memory cells are utilized, then each memory cell will change logic states only once to reach a count of 1,000. Thus, a ring counting sequence utilizing 1,000 memory cells can count to 1,000,000,000 before wearing out. Therefore, in the 1,000 cell example, a ring counting sequence provides a 1,000 times improvement over a conventional base-2 counting sequence.

A ring counting sequence alone, however, is very inefficient. For example, to implement a count of 1,000,000, a ring counting sequence requires 1,000,000 memory cells whereas as base-2 counting sequence requires only 20 memory cells. Thus, by utilizing a combination of a ring counting sequence and a base-2 counting sequence, the increased count of a ring counting sequence and the efficiency of a base-2 counting sequence can both be realized.

As stated above, the minimum number of counting positions is determined by the maximum count that is required by a particular application and the lifecycle of the memory cells that are utilized to represent the counting positions. For example, if a maximum count of 100,000,000 is required and the lifecycle of the memory cells is 1,000,000 logic changes, then the least significant counting position of the base-2 counting sequence must be limited to 1,000,000 logic changes. Thus, a count of 100,000,000 can be obtain by using 1,000 memory cells in a ring counting sequence and 20 memory cells in a base-2 counting sequence.

Referring again to FIG. 1, counter 100 includes an r column by s row non-volatile memory 110 that stores the logical state defined by a logical state signal RLSS in one of a series of memory cells in response to a write enable signal RWEN. As is well known in the art, each memory cell is uniquely identified by a row address word RRA and column address word RCA. Memory 110 also generates a row output word RRO, which represents the logical state stored in each of the memory cells in a row of memory cells identified by the row address word RRA, in response to a read enable signal RREN.

Memory 110 can be implemented with any standard electrically erasable programmable read-only-memory (EEPROM) which is large enough to satisfy the requirements of the specific application. Alternately, memory 110, along with the remaining elements of counter 100, can be incorporated into a single integrated circuit.

Counter 100 also includes an r column by s row non-volatile memory 112 that stores the logical state defined by a logical state word BLSS in one or more of a series of memory cells in response to a write enable signal BWEN. As described in greater detail below, memory 112 utilizes a single row of memory cells. Thus, each memory cell in the single row of memory cells is uniquely identified by a column address word BCA.

Memory 112 also generates a row output word BRO, which represents the logical state stored in each of the memory cells in a row of memory cells, in response to a read enable signal BREN. As above, Memory 112 can also be implemented with any standard EEPROM.

As stated above, the maximum count of the base-2 counting sequence is limited by the lifecycle of the least significant counting position which, in turn, limits the maximum number of memory cells which can be utilized to implement a base-2 counting sequence. In other words, if a base-2 counting sequence can never change the logic states of more than a predetermined number of cells without the first cell wearing out, the inclusion of more than that number of cells is meaningless.

Thus, in the preferred embodiment, memory 112 is implemented as a single row memory. As a result, in an alternative embodiment, memory 110 and memory 112 can be implemented by utilizing a single EEPROM where one of the rows represents the base-2 counting sequence.

In operation, memory 110 is utilized to implement the ring counting sequence while memory 112 is utilized to implement the binary counting sequence. As a result, memory 110 stores a first portion of an event count and memory 112 stores a second portion of the event count.

The total event count can then be determined by reading the first portion of the event count stored in memory 110, and the second portion of the event count stored in memory 112. The first portion of the event count can be determined by sequentially reading the portion of the event count that is stored in each row of memory 110, while the second portion of the event count can be determined by reading the single row of memory cells in memory 112.

As described above with reference to FIG. 2, in the first stage of a ring counting sequence, the logic state of one counting position is sequentially changed one counting position at a time from a logic low to a logic high in response to each detected event until all of the counting positions are represented by a logic high. Thus, in the context of a memory array, the logic state of one memory cell is sequentially changed one cell at a time to a logic high in response to each detected event until all of the memory cells in that row are set to a logic high. Following this, the logic state of one memory cell in the next row of the array is sequentially changed one cell at a time to a logic high until all of the memory cells in that row are also set to a logic high. This process continues until the memory cells in all of the rows of memory 110 are set to a logic high.

Once all of the memory cells in all of the rows are set to a logic high, the next event is recorded by setting the logic state of the least significant memory cell in memory 112 to a logic high.

In the second stage of the ring counting sequence, the process switches and the logic state of one memory cell is sequentially changed one cell at a time to a logic low in response to each detected event until all of the memory cells in that row are set to a logic low. This process continues until the memory cells in all of the rows of the array are set to a logic low.

As above, once all of the memory cells in all of the rows are set to a logic low, the next event is recorded by setting the logic state of the least significant memory cell and the next-to-least significant memory cell in memory 112 to a logic low and a logic high, respectively.

Thus, the logic state of the least significant memory cell in memory 112 can also be interpreted to indicate whether the ring counting sequence is in the first stage or the second stage. As a result, the logic state of the least significant memory cell can be utilized to define the logic state of the logical state signal RLSS.

Thus, counter 100 also includes an inverter 114 that generates the logical state signal RLSS by inverting the logic state of the least significant memory cell. In the preferred embodiment, memory 112 is continuously read when memory 110 is being written to while the last three counting positions of the last row of memory 110 are continuously read when memory 112 is being written to. By continuously reading memories 110 and 112 as described above, the logical state signal RLSS will remain valid, even in the presence of transient conditions.

In a typical operation, counter 100 is powered up only when an external event is detected, and is powered down after the event has been recorded. Thus, each time an event is detected, counter 100 must determine which row contains the next memory cell to be changed. In the preferred embodiment, counter 100 utilizes a latch 116, an invertor/bypass multiplexer 118, and a priority encoder 120 to determine the location of the next memory cell in memory 110 to be changed.

As shown in FIG. 1, latch 116 latches the row output word RRO in response to a latch signal LAT1. Multiplexer 118 passes the row output word RRO when the logical state signal RLSS indicates that a logic high or one is being written in memory 110 in response to each detected event, and inverts the row output word RRO when the logical state signal RLSS indicates that a logic low or zero is being written in memory 110 in response to each detected event.

Thus, for example, when the ring counting sequence is in the first stage, the logical state signal RLSS, which is represented as a logic high, is utilized by memory 110 to write a logic high into the next memory cell, and by multiplexer 118 to pass the row output word RRO uninverted. Similarly, when the ring counting sequence is in the second stage, the logical state signal RLSS, which is represented as a logic low, is utilized by memory 110 to write a logic low into the next memory cell, and by multiplexer 118 to invert the row output word RRO.

Encoder 120 determines whether the logical states of the row output word RRO that is either passed through or inverted by multiplexer 118 are equivalent. Thus, when the ring counting sequence is operating in the first stage, e.g., the memory cells are being sequentially changed from a logic low to a logic high, and the row output word RRO is represented by all logic highs or ones, encoder 120 signals that the row is full by generating a row full signal RFL.

When the ring counting sequence is operating in the second stage, e.g., the memory cells are being sequentially changed from a logic high to a logic low, multiplexer 118, as stated above, inverts the logic states of all of the memory cells in that row. As a result, when a row is full, the row output word RRO stored in a row of memory 110 is still represented by all logic highs or ones. Thus, by utilizing multiplexer 118, encoder 120 can utilize the same logic regardless of whether the ring counting sequence is in the first or second stages.

When the row output word RRO contains both logic highs and logic lows, encoder 120 generates the column address word RCA by identifying which column of the row output word RRO changes from a logic high to a logic low. Since a combination of logic highs and logic lows are present in the same row, the existing row address word RRA is correct and need not be changed.

FIG. 3 shows a truth table that illustrates the operation of priority encoder 120. As shown in FIG. 3, the column address word RCA is encoded to define which column contains a zero. The column address word RCA is then decoded by memory 110.

Referring again to FIG. 1, the row addresses for memory 110 are generated by a row counter 122 that resets the row address word RRA to a first row in response to a reset signal RST, that increments the row address word RRA in response to an increment signal INC, and that generates a memory full signal MFL when the row address word RRA has been incremented to its maximum value.

As stated above, counter 100 utilizes latch 116, multiplexer 118, and encoder 120 to determine the location of the next memory cell in memory 110 to be changed. Similarly, counter 100 utilizes a latch 124, binary code increment logic 126, and column select logic 128 to determine the location of the next memory cell in memory 112 to be changed.

As shown in FIG. 1, latch 124 latches the row output word BRO that is output from memory 112 in response to a latch signal LAT2. Binary code increment logic 126 then generates the binary logical state word BLSS by incrementing the row output word BRO by one, in accordance with a base-2 counting sequence. As a result, the logical state word BLSS defines the logical state of each of the memory cells of memory 112.

Column select logic 128 generates the column address word BCA by comparing the row output word BRO latched by latch 124 and the logical state word BLSS generated by binary code increment logic 126. The column address word BCA identifies each of the columns where the logical states of the logical state word BLSS differ from the logical states of the row output word BRO. As a result, the column address word BCA identifies each of the columns of memory 112 that are to be changed.

For example, if the row output word BRO is equivalent to [0-0-0-0], and the logical state word BLSS is equivalent to [0-0-0-1], then the column address word BCA would indicate that the logical state of the fourth column is to be changed.

The counting sequence is controlled by count control logic 130 that generates the reset signal RST and asserts the read enable signal BREN each time an externally-generated event signal EV is detected, and that generates the increment signal INC each time the row full signal RFL is detected. The externally-generated event signal EV may represent, for example, the consumption of one unit of utility service.

In addition, logic 130 asserts the read enable signal RREN and generates the latch signal LAT1 a delay time D1 and a delay time D2, respectively, after each event signal EV is detected. Delay time D1 provides the time required for row counter 122 to generate the row address word RRA, and the time required for the row address word RRA to settle at the row address input of memory 110 as well as the time required for the logical state signal RLSS to settle at the input of memory 112. Delay time D2 provides the time required for the logic states at the outputs of memory 110 to settle.

Logic 130 further asserts the write enable signal RWEN a delay time D3 after the reset signal RST is generated, and after each increment signal INC is generated, in the absence of the row full signal RFL. Delay time D3 provides the time required for the portion of the event count stored in a row of memory 110 to be latched by latch 116, the time required for encoder 120 to determine whether the row is full and, if not full, generate the column address word RCA of the next memory cell to be changed, and the time required for the column address word RCA to settle at the column address input of memory 110.

As stated above, when a row is full, e.g., when the logic states of all of the memory cells in that row have the same logic state, encoder 120 generates the row full signal RFL. Thus, if the row full signal RFL has not been generated by the end of delay time D3, the column and row address have settled and memory 110 is ready to be write enabled.

Logic 130 further generates the latch signal LAT2 in response to the memory full signal MFL, deasserts the read enable signal BREN a delay time D4 after the memory full signal is generated, and asserts the write enable signal BWEN a delay time D5 after the latch signal LAT2 is generated. The delay time D4 allows the outputs at latch 124 to settle while delay time D5 allows the inputs to memory 112 to settle.

Further, when the memory is full, logic 130 evaluates the logic states of the last three counting positions of the last row of memory 110 in lieu of the memory full signal MFL. Thus, logic 130 will correctly interpret memory 110 to be full even in the presence of transient conditions which could alter the logical state of the memory full signal MFL.

Figure 4:
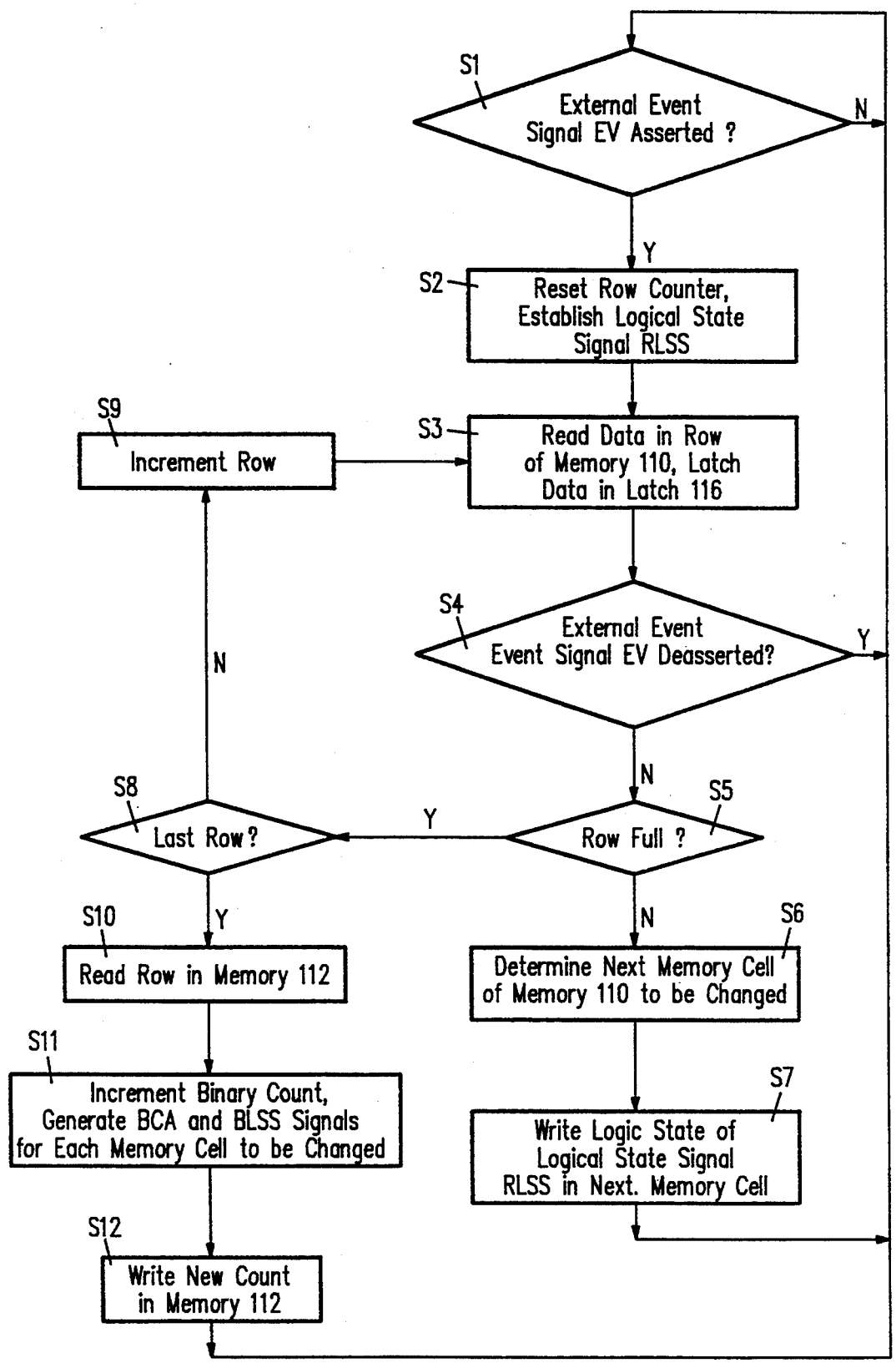
FIG. 4 is a flow chart illustrating the operation of counter 100 in accordance with the present invention.

FIG. 4 shows a flow chart that illustrates the operation of counter 100 in accordance with the present invention. As shown in FIG. 4, operation begins at step S1 with the determination of whether the external event signal EV is asserted.

When the external event signal EV is asserted, operation moves to step S2 where the row address RRA is reset to the first row address and memory 112 is read to establish the logical state of the logical state signal RLSS.

Following this, operation moves to step S3 where the row output word RRO stored in the first row of memory 110 is read and latched by latch 116. Next, operation moves to step S4 where a determination is made as to whether the external event signal EV remains asserted. If the external event signal EV is deasserted, the event signal EV is assumed to be spurious and operation returns to step S1 to await the next event signal EV.

If the external event signal EV remains asserted, operation moves to step S5 where encoder 120 determines whether the first row is full, e.g., whether all of the memory cells in the first row have the same logic state. When the first row is not full, operation moves to step S6 where encoder 120 determines the column address of the next memory cell to be changed. Next, operation moves to step S7 where the logic state of the logical state signal RLSS is written into the next memory cell to be changed. After this, operation returns to step S1 to await the next event signal EV.

When, at step S5, encoder 120 determines that the first row is full, operation moves to step S8 where logic 130 determines whether memory 110 is full, e.g., whether the memory full signal MFL is asserted. When the memory is not full, operation moves to step S9 where row counter 122 increments the row address word RRA to the second row in response to the increment signal INC generated by logic 130. After this, operation proceeds as described above for each successive row until the next memory cell to be changed is located, or memory 110 is determined to be full.

When, at step S8, logic 130 determines that memory 110 is full, operation moves to step S10. At step S10, binary increment logic 126 and column select logic 128 read the row output word BRO as latched in latch 124. Next, operation moves to step S11 where binary increment logic 126 increments the count in accordance with a base-2 counting sequence to generate the logical state word BLSS, and column select logic 128 generates the column address word BCA. Operation then moves to step S12 where the new count is written into memory 112. After this, operation returns to step S1 to await the next event signal EV.

Figures 5, 6:
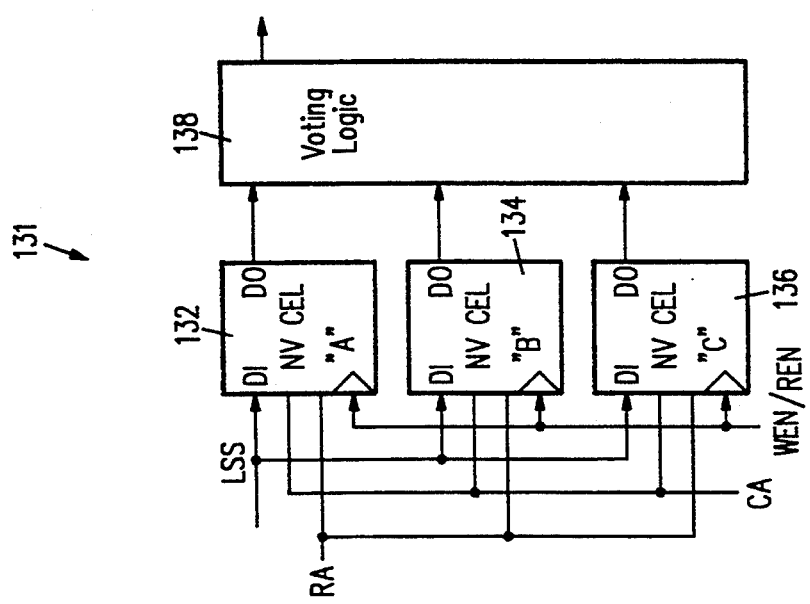
FIG. 5 is a block diagram that illustrates a multiple memory cell stage 131 in accordance with a first alternative embodiment.
FIG. 6 is a counting diagram of a ring counting sequence and a base-2 counting sequence illustrating the operation of a second alternative embodiment for a count ranging from zero to fifteen.

In a first alternative embodiment, instead of utilizing a single memory cell to represent a single counting position, the reliability of counter 100 can be increased by utilizing a multiple memory cell stage to represent a single counting position. FIG. 5 shows a block diagram that illustrates a multiple memory cell stage 131 in accordance with the first alternative embodiment.

As shown in FIG. 5, multiple memory cell stage 131 includes three memory cells 132, 134, and 136, and a voting logic circuit 138. In operation, the logic states of memory cells 132, 134, and 136 are set in the same manner as the memory cells in memory 110 or 112 are set except that instead of changing the logic state of one cell, three cells are changed. Thus, the logic states of memory cells 132, 134, and 136 are set in response to a column address word CA, a row address word RA, a logical state signal LSS which, as above, indicates the logic state that is to be written into memory cells 132, 134, and 136, and a write enable signal WEN.

As with the memory cells in memory 110 or 112, memory cells 132, 134, and 136 are read in response to the row address word RA and a read enable signal REN. The signal that represents the output of memory cells 132, 134, and 136, however, is generated by voting logic 138 with a logical state that represents the logical state of the majority of the outputs of memory cells 132, 134, and 136.

Thus, the advantage of utilizing three memory cells to represent a single counting position is that one of the cells out of each group of three can fail, e.g., become stuck at one logical state, without effecting the value of the count. Thus, to fail there must be two defective cells out of a group of three cells.

Further, a greater accuracy can be obtained by using a counter which utilizes three cells to represent a single counting position than can be obtained by comparing the count of three independent counters where each independent counter utilizes a single cell to represent each location.

This greater accuracy is a result of the fact that, in a single independent binary counter, a single failed cell will corrupt the entire count of that counter. Thus, it takes only one failed cell in two of the three counters to corrupt the count. For example, assuming a 10-bit counter with two failed cells, the odds are only 2 in 29 that the count is defective when a three-cell memory stage is utilized to represent each counting position whereas the odds are 20 in 29 that the count is defective when three independent counters are utilized.

Although the first alternative embodiment has been described with three memory cells, any number of memory cells can be utilized to increase the accuracy of counter 10. The advantage of utilizing odd numbers of cells is that some number of cells can fail without effecting the accuracy of the logical state represented by voting logic 48. For example, when three cells are utilized, one cell can fail without effecting the accuracy while with five cells, two cells can fail without causing a defective count.

On the other hand, the advantage of utilizing four or more even number of cells is that, in addition to the cell failure tolerance of odd-numbered cells, the existence of failed cells can be detected. For example, with four cells, if two cells are defective and stuck at the same logic state, voting logic 138 will eventually see two signals representing a logical state of one and two signals representing a logical state of zero, thereby indicating that two of the memory cells within that group of four have failed. In the preferred embodiment, failed cells are detected by externally reading the logical state of each of the cells in each group. Alternately, error indicating logic can also be used.

In a second alternative embodiment, the ring counting sequence can also be configured to sequentially change the logic state of two counting positions each time an event is detected. FIG. 6 shows a counting diagram of a ring counting sequence and a base-2 counting sequence that illustrates the operation of the second alternative embodiment for a count ranging from zero to fifteen.

As shown in FIG. 6, when the count is zero, counting position RC1 is represented as a logic high while counting positions RC2–4 and BT1–Bt3 are represented by as a logic low. As the count increases from zero to one, the logical state of counting position RC2 changes to a logic high while the logical state of counting position RC1 changes from a logic high to a logic low. As the count incrementally increases, the logical state of the next counting position changes from a logic low to a logic high while the previous counting position changes from a logic high to a logic low.

The principal disadvantage of the second alternative embodiment is that the logical states of two memory cells are changed each time an event is detected, e.g. one memory cell always changes from one to zero while another memory cell always changes from zero to one. As a result, the sequence of the second alternative embodiment will wear out twice as fast as the sequence where the logic state of only one memory cell is changed each time an event is detected.

In a third alternative embodiment, counter 100 of each of the previous embodiments can also incorporate a prescalar which generates a scaled event signal in response to a predetermined number of externally-generated event signals. In this embodiment, the scaled event signal is received by counter 100 as the event signal EV.

It should be understood that various alternatives to the embodiments of the invention described herein and maybe employed in practicing the invention. For example, although the ring counting sequence has been described with a right-to-left counting order, any counting order that changes the logic state of only one counting position each time an event is detected is intended to be included within the scope of the present invention. Thus, it is intended that the following claims define the scope of the invention, and that methods and apparatus within the scope of these claims be covered thereby.

What is claimed is:

1. A non-volatile counter for counting a plurality of events signals, the counter comprising:
    a plurality of non-volatile memory cells logically divided into a first sequence of memory cells and a second sequence of memory cells, the second sequence of memory cells beginning with a least significant memory cell; and
    a counting logic stage that responds to the first n−1 event signals out of every n event signals by sequentially changing the logic state of a memory cell in the first sequence of memory cells each time the event signal is detected, that changes the logic state of the least significant memory cell each time the nth event signal is detected, and that changes the logic state of each remaining memory cell in the second sequence of memory cells each time the logic state of the immediately preceding memory cell in the second sequence of memory cells has been changed twice.

2. The counter of claim 1 wherein the first sequence of memory cells includes n−1 memory cells.

3. The counter of claim 1 wherein the first sequence of memory cells is implemented in a first electrically erasable programmable read-only-memory (EEPROM) and the second sequence of memory cell is implemented in a second EEPROM.

4. The counter of claim 1 wherein the first sequence of memory cells and the second sequence of memory cells are implemented in an electrically erasable programmable read-only-memory (EEPROM).

5. The counter of claim 1 wherein the logic states of the memory cells in the first sequence of memory cells are maintained during the nth event signal.

6. The counter of claim 1 wherein the counter is implemented as a single integrated circuit.

7. The counter of claim 1 wherein the counting logic stage changes the logic state of one memory cell in the first sequence of memory cells each time the event signal is detected.

8. The counter of claim 7 wherein the counting logic stage implements a Johnson counting sequence when changing the logic state of the memory cells in the first sequence of memory cells.

9. The counter of claim 8 wherein the first sequence of memory cells is organized as a plurality of rows of memory cells, and wherein the logic state of all of the memory cells in one row are changed once before the logic states of any of the memory cells in another row are changed.

10. The counter of claim 9 wherein when the counting logic stage changes the logic state of said one memory cell, the counting logic stage starts at one end of said one row and identifies a next memory cell having a logic state that remains unchanged.

11. A non-volatile counter for counting a plurality of events signals, the counter comprising:
    a first non-volatile memory that stores a logical state defined by a ring logical state signal in a memory cell identified by a ring row address word and ring column address word in response to a ring write enable signal, and that generates a ring row output word representing the logical state stored in each of the memory cells in a row of memory cells identified by the ring row address word in response to a ring read enable signal;
    a second non-volatile memory that stores the logical states defined by a binary logical state word in one or more memory cells identified by a binary column address word in response to a binary write enable signal, and that generates a binary row output word representing the logical state stored in each of the memory cells in a row of memory cells of the second non-volatile memory in response to a binary read enable signal;

an inverter that generates the ring logical state signal by inverting the logic state of a memory cell of the second non-volatile memory;

a first latch that latches the logic states of the ring row output word in response to a first latch signal;

a multiplexer that passes the ring row output word latched by the first latch when the ring logical state signal indicates that a first logic state is being written in the first non-volatile memory, and that inverts the logic states of the ring row output word when the ring logical state signal indicates that a second logic state is being written in the first non-volatile memory;

an encoder that determines whether the logical states of ring row output word that are either passed through or inverted by the multiplexer are equivalent, that generates a row full signal when the logical states of the ring row output word are equivalent, and that generates the ring column address word when the logical states of the ring row output word vary by identifying which column of the ring row output word changes from the first logic state to the second logic state;

a row counter that generates the ring row address word by resetting the row address word in response to a reset signal, by incrementing the row address word in response to an increment signal, and by generating a memory full signal when the row address word has been incremented to a maximum value;

a second latch that latches the logic states of the binary row output word in response to a second latch signal;

binary code increment logic that generates the binary logical state word by incrementing the binary row output word latched by the second latch;

column select logic that generates the binary column address word by comparing the binary row output word latched by the second latch and the binary logical state word, the binary column address word identifying each of the columns where the logical states of the binary logical state word differ from the logical states of the binary row output word; and count control logic that generates the reset signal and asserts the binary read enable signal each time the event signal is detected, that generates the increment signal each time the row full signal is detected, that asserts the ring read enable signal and generates the first latch signal a first delay time and a second delay time, respectively, after each event signal is detected, that asserts the ring write enable signal a settling delay time after the reset signal is generated, and after the increment signal is generated, in the absence of the row full signal, that generates the second latch signal in response to the memory full signal, that deasserts the binary read enable signal a third delay time after the second latch signal is generated, and that asserts the binary write enable signal a fourth delay time after the second latch signal is generated.

12. A non-volatile counter for counting a plurality of events signals, the counter comprising:

a plurality of non-volatile memory cellos logically divided into a first sequence of memory cells and a second sequence of memory cells, the second sequence of memory cells beginning with a least significant memory cell; and a counting logic stage that responds to the first n−1 event signals of every n event signals by sequentially changing the logic state of two memory cells in the first sequence of memory cells each time the event signal is detected, that changes the logic state of the least significant memory cell each time the nth event signal is detected, and that changes the logic state of each remaining memory cell in the second sequence of memory cells each time the logic state of the immediately preceding memory cell in the second sequence of memory cells has been changed twice.

13. The counter of claim 1 and further comprising a prescalar that generates a scaled event signal in response to the event signal wherein the counting logic stage receives the scaled event signal as the event signal.

14. A non-volatile counter for counting a plurality of events signals, the counter comprising:

a plurality of non-volatile memory stages logically divided into a first sequence of memory stages and a second sequence of memory stages, each memory stage having a logic state that represents a single counting position in a counting sequence, the second sequence of memory stages beginning with a least significant memory stage; and a counting logic stage that responds to the first n−1 event signals out of every n event signals by sequentially changing the logic state of a memory stage in the first sequence of memory stages each time the event signal is detected, that changes the logic state of the least significant memory stage each time the nth event signal is detected, and that changes the logic state of each remaining memory stage in the second sequence of memory stages each time the logic state of the immediately preceding memory stage in the second sequence of memory stages has been changed twice.

15. The counter of claim 14 wherein a memory stage includes a single memory cell.

16. The counter of claim 14 wherein a memory stage includes:

at least three memory cells, each memory cell generating an output signal that represents the logic state of the memory cell in response to a row address signal, a column address signal, and a read enable signal; and a voting logic stage that generates a memory stage output signal that represents the logic state of a majority of the output signals from the at least three memory cells.

17. The counter of claim 14 wherein the first sequence of memory stages includes n−1 memory stages.

18. The counter of claim 14 wherein the first sequence of memory stages is implemented in a first electrically erasable programmable read-only-memory (EEPROM) and the second sequence of memory stages is implemented in a second EEPROM.

19. The counter of claim 14 wherein the first sequence of memory stages and the second sequence of memory stages are implemented in an electrically erasable programmable read-only-memory (EEPROM).

20. The counter of claim 6 and further comprising a prescalar that generates a scaled event signal in response to the event signal wherein the counting logic stage receives the scaled event signal as the event signal.

21. The counter of claim 14 wherein the logic states of the memory stages in the first sequence of memory stages are maintained during the nth event signal.

22. The counter of claim 14 wherein the counting logic stage changes the logic state of one memory stage in the first sequence of memory stages each time the event signal is detected.

23. The counter of claim 22 wherein the counting logic stage implements a Johnson counting sequence when changing the logic state of the memory stages in the first sequence of memory stages.

24. The counter of claim 23 wherein the first sequence of memory stages is organized as a plurality of rows of memory stages, and wherein the logic state of all of the memory stages in one row are changed once before the logic states of any of the memory stages in another row are changed.

25. The counter of claim 24 wherein when the counting logic stage changes the logic state of said one memory stage, the counting logic stage starts at one end of said one row and identifies a next memory stage having a logic state that remains unchanged.

26. A method for counting and maintaining a non-volatile count of a plurality of events signals, the method comprising the steps of:

provirding a plurality of non-volatile memory cells logically divided into a first sequence of memory cells and a second sequence of memory cells, the second sequence of memory cells beginning with a least significant memory cell;

responding to the first n−1 event signals out of every n event signals by sequentially changing the logic state of one memory cell in the first sequence of memory cells each time the event signal is detected, and by maintaining the logic states of the memory cells in the first sequence of memory cells during the nth event signal;

changing the logic state of the least significant memory cell each time the nth event signal is detected; and changing the logic state of each remaining memory cell in the plurality of second memory cells each time the logic state of the immediately preceding memory cell has been changed twice.

27. A non-volatile counter for counting a plurality of event signals, the counter comprising:

a plurality of non-volatile memory cells logically divided into a first sequence of memory cells and a second sequence of memory cells, the second sequence of memory cells beginning with a least significant memory cell; and a counting logic stage that changes the logic state of a memory cell in the first sequence of memory cells each time an event signal is detected, that changes the logic state of the least significant memory cell each time an nth event signal is detected, and that changes the logic state of each remaining memory cell in the second sequence of memory cells each time the logic state of the immediately preceding memory cell in the second sequence of memory cells has been changed twice.

28. The counter of claim 27 wherein the counting logic stage changes the logic state of one memory cell in the first sequence of memory cells each time the event signal is detected.

29. The counter of claim 28 wherein the counting logic stage implements a Johnson counting sequence when changing the logic state of the memory cells in the first sequence of memory cells.

30. The counter of claim 29 wherein the first sequence of memory cells is organized as a plurality of rows of memory cells, and wherein the logic state of all of the memory cells in one row are changed once before the logic states of any of the memory cells in another row are changed.

31. The counter of claim 30 wherein when the counting logic stage changes the Logic state of said one memory cell, the counting logic state starts at one end of said one row and identifies a next memory cell having a logic state that remains unchanged.

32. A non-volatile counter for counting a plurality of events signals, the counter comprising:

a plurality of non-volatile memory stages logically divided into a first sequence of memory stages and a second sequence of-memory stages, each memory stage having a logic state that represents a single counting position in a counting sequence, the second sequence of memory stages beginning with a least significant memory stage; and a counting logic stage that changes the logic state of a memory stage in the first sequence of memory stages each time the event signal is detected, that changes the logic state of the least significant memory stage each time the nth event signal is detected, and that changes the logic state of each remaining memory stage in the second sequence of memory stages each time the logic state of the immediately preceding memory stage in the second sequence of memory stages has been changed twice.

33. The counter of claim 32 wherein a memory stage includes a single memory cell.

34. The counter of claim 32 wherein a memory stage includes:

at least three memory cells, each memory cell generating an output signal that represents the logic state of the memory cell in response to a row address signal, a column address signal, and a read enable signal; and a voting logic stage that generates a memory stage output signal that represents the logic state of a majority of the output signals from the at least three memory cells.

35. The counter of claim 34 wherein the first sequence of memory stages is organized as a plurality of rows of memory stages, and wherein the logic state of all of the memory stages in one row are changed once before the logic states of any of the memory stages in another row are changed.

36. The counter of claim 35 wherein when the counting logic stage changes the logic state of said one memory stage, the counting logic stage starts at one end of said one row and identifies a next memory stage having a logic state that remains unchanged.

* * * * *

UNITED STATES PATENT AND TRADEMARK OFFICE
CERTIFICATE OF CORRECTION

PATENT NO. : 5,450,460
DATED : September 12, 1995
INVENTOR(S) : Robert Stodieck

It is certified that error appears in the above-indentified patent and that said Letters Patent is hereby corrected as shown below:

In Col. 13, line 59, please delete the "-" after "signal".

In Col. 13, line 64, please delete "cellos" and replace with --cells--.

In Col. 16, line 14, please delete "L" in the second occurence of "logic" and replace with --l--.

In Col. 16, line 22, please delete the "-" after "of".

Signed and Sealed this

Nineteenth Day of December, 1995

Attest:

BRUCE LEHMAN

Attesting Officer

Commissioner of Patents and Trademarks